(12) United States Patent
Gu

(10) Patent No.: US 11,545,467 B2
(45) Date of Patent: Jan. 3, 2023

(54) IC DIE TO IC DIE INTERCONNECT USING ERROR CORRECTING CODE AND DATA PATH INTERLEAVING

(71) Applicant: Huawei Technologies Co., Ltd., Shenzhen (CN)

(72) Inventor: Shiqun Gu, San Diego, CA (US)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/199,030

(22) Filed: Mar. 11, 2021

(65) Prior Publication Data
US 2021/0202447 A1   Jul. 1, 2021

Related U.S. Application Data

(63) Continuation of application No. PCT/CN2019/092911, filed on Jun. 26, 2019.

(60) Provisional application No. 62/730,048, filed on Sep. 12, 2018.

(51) Int. Cl.
*G06F 13/40* (2006.01)
*H01L 25/065* (2006.01)
*H01L 21/66* (2006.01)
*H01L 23/00* (2006.01)

(52) U.S. Cl.
CPC ...... *H01L 25/0657* (2013.01); *G06F 13/4027* (2013.01); *H01L 22/34* (2013.01); *H01L 24/08* (2013.01); *H01L 2224/08145* (2013.01); *H01L 2225/06596* (2013.01)

(58) Field of Classification Search
CPC . G06F 13/4027; H01L 25/0657; H01L 22/34; H01L 24/08; H01L 2224/08145; H01L 2225/06596
See application file for complete search history.

(56) References Cited

U.S. PATENT DOCUMENTS

| | | |
|---|---|---|
| 5,303,180 A | 4/1994 | McAdams |
| 9,124,300 B2 * | 9/2015 | Sharon ............. H03M 13/2942 |
| 9,684,474 B2 * | 6/2017 | Somaiya ............... G06F 3/0673 |

(Continued)

FOREIGN PATENT DOCUMENTS

EP        0551973 A2    7/1993

*Primary Examiner* — Steven G Snyder
*Assistant Examiner* — Christopher A Daley
(74) *Attorney, Agent, or Firm* — Vierra Magen Marcus LLP

(57) ABSTRACT

A multi-chip module includes a first Integrated Circuit (IC) die a second IC die. The first IC die includes an array of first bond pads, a plurality of first code group circuits, and first interleaved interconnections between the plurality of first code group circuits and the array of first bond pads, the first interleaved interconnections including a first interleaving pattern causing data from different code group circuits to be coupled to adjacent first bond pads. The second IC die includes a second array of bond pads that electrically couple to the array of first bond pads, a plurality of second code group circuits, and second interleaved interconnections between the plurality of second code group circuits and the array of second bond pads, the second interleaved interconnections including a second interleaving pattern causing data from different code groups to be coupled to adjacent second bond pads.

23 Claims, 9 Drawing Sheets

(56) References Cited

U.S. PATENT DOCUMENTS

| | | | |
|---|---|---|---|
| 9,846,192 B2* | 12/2017 | Geerlings | G01R 31/2884 |
| 10,074,579 B1* | 9/2018 | Kim | G11C 29/32 |
| 10,282,264 B1* | 5/2019 | Ogasawara | G11C 29/816 |
| 10,727,200 B2* | 7/2020 | Choo | G06F 3/0659 |
| 10,879,903 B2* | 12/2020 | Chromczak | H01L 24/16 |
| 2001/0044660 A1 | 11/2001 | Bon et al. | |
| 2009/0177943 A1* | 7/2009 | Silvus | H03M 13/293 |
| | | | 714/755 |
| 2011/0246746 A1 | 10/2011 | Keeth et al. | |
| 2013/0159587 A1* | 6/2013 | Nygren | G11C 5/063 |
| | | | 710/306 |
| 2013/0159887 A1* | 6/2013 | Whitmyer, Jr. | G06F 16/958 |
| | | | 715/760 |
| 2014/0240033 A1 | 8/2014 | Rathi et al. | |
| 2015/0280748 A1* | 10/2015 | Gendler | H03M 13/2906 |
| | | | 714/755 |
| 2017/0207195 A1 | 7/2017 | Sirocka et al. | |
| 2017/0250160 A1* | 8/2017 | Wu | H01L 24/02 |
| 2019/0163408 A1* | 5/2019 | Berger | G06F 12/0246 |
| 2020/0097362 A1* | 3/2020 | Law | H03M 13/616 |
| 2021/0151120 A1* | 5/2021 | Law | G11C 29/78 |
| 2021/0375384 A1* | 12/2021 | Sharon | G11C 29/42 |

* cited by examiner

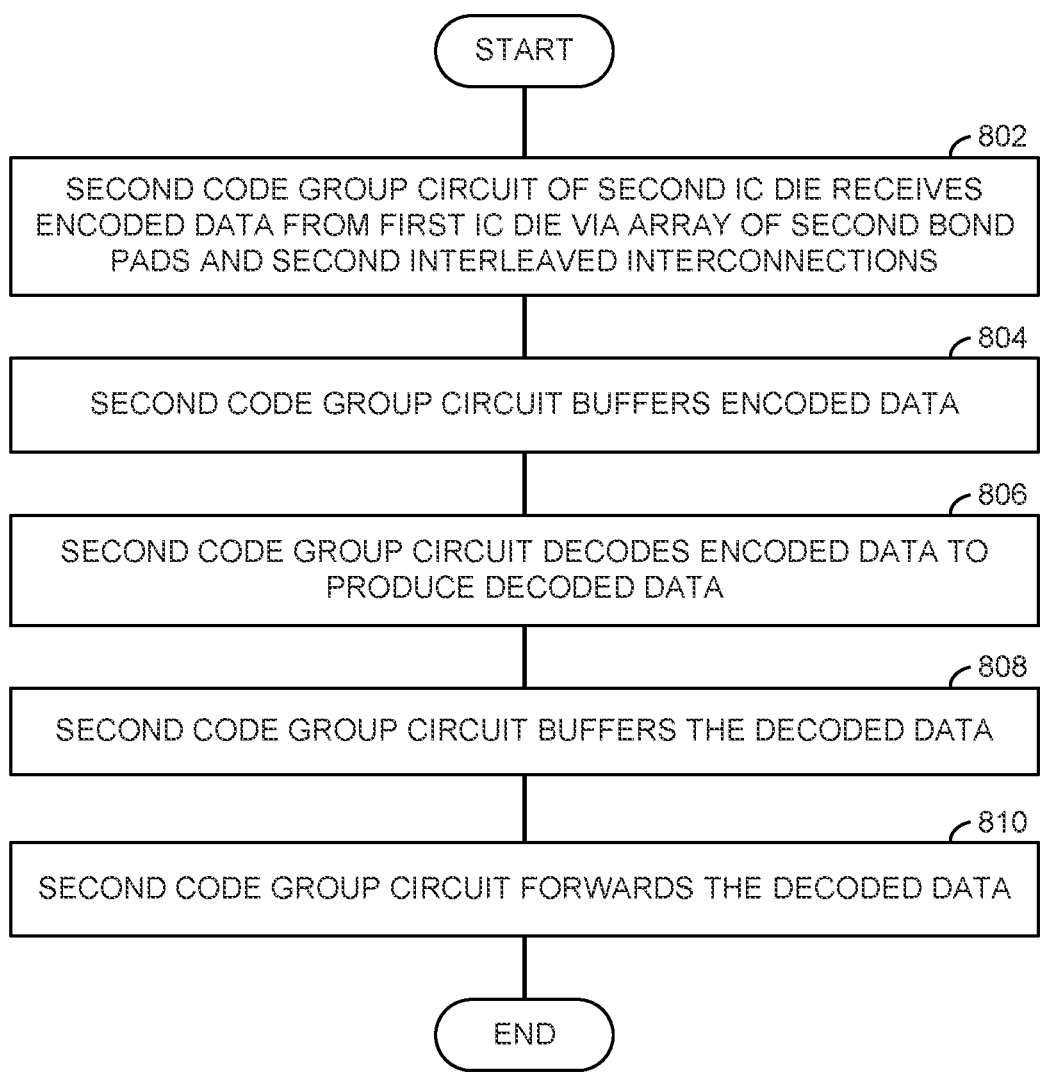

IC DIE TO IC DIE INTERCONNECT USING ERROR CORRECTING CODE AND DATA PATH INTERLEAVING

CROSS-REFERENCE TO RELATED APPLICATIONS

This application is a continuation of PCT Application No. PCT/CN2019/092911 filed on Jun. 26, 2019 which claims priority to U.S. provisional patent application Ser. No. 62/730,048, filed on Sep. 12, 2018 and entitled "IC Die To IC Die Interconnect Using Error Correcting Code And Data Path Interleaving", which is incorporated herein by reference as if reproduced in its entirety.

TECHNICAL FIELD

The present application relates to Integrated Circuit (IC) technology; and more particularly to communications between IC dies of a multi-chip module.

BACKGROUND

Integrated Circuit (IC) technology has advanced greatly over the past fifty years. ICs are now pervasive and present in electronic devices, machinery, vehicles, appliances, and many other devices. Large processing ICs now include billions of transistors while memory ICs include hundreds of billions of transistors. The density of transistors on ICs can reach 100 million transistors per square millimeter. However, the processing capability of a single IC may not be sufficient to meet required processing needs. Thus, ICs may be bonded together so that the two (or more) ICs are closely coupled and provide greater processing capabilities.

Die to Die (D2D) interconnects between ICs are enabled by interconnecting bond pads ("pads") on sandwiched ICs to create a multi-chip module. Soldering has been used to electrically couple the bond pads of one IC to the bond pads of another IC. However, soldering requires the bond pads to be spaced apart with sufficient pitch so that the solder does not bleed between bond pads to thereby short the bond pads to one another. A newer technique directly bonds the copper bond pads of one IC to the copper bond pads of another IC without using solder. This newer technique supports smaller pitch between adjacent bonds pads than the older technique that uses solder. In either implementation, when adjacent bond pads are shorted due to solder or bond pad faults or open due to defects such as particles or polish induced dishing, data transmitted between the ICs is corrupted.

One prior approach to overcoming the problems caused by bond pad shorts/opens was to use two or more redundant bond pads for at least some data. However, with a doubling of bond pads for redundancy, the Silicon area of the bond pad array increases proportionally with redundancy, resulting in high Silicon area cost, additional energy consumption from high capacitance load, and resultantly an increase in heat generation. A doubling of bond pads and connections is not preferred.

SUMMARY

According to a first embodiment of the present disclosure, a multi-chip module includes a first Integrated Circuit (IC) die and a second IC die. The first IC die has an array of first bond pads, a plurality of first code group circuits, and first interleaved interconnections between the plurality of first code group circuits and the array of first bond pads. The first interleaved interconnections include a first interleaving pattern causing data from different code group circuits to be coupled to adjacent first bond pads. The second IC die has a second array of bond pads that electrically couple to the array of first bond pads, a plurality of second code group circuits, and second interleaved interconnections between the plurality of second code group circuits and the array of second bond pads, the second interleaved interconnections including a second interleaving pattern causing data from different code groups to be coupled to adjacent second bond pads.

The multi-chip module provides important benefits and advantages over prior structures/devices. By encoding data for transmission to a differing IC and by interleaving the data after encoding, the first embodiment can correct one or more adjacent bond pad shorts, detect two or more adjacent bond pad shorts, and correct two or more bond pad opens (even if adjacent to one another). The level of correction and detection of bond pad shorts and bond pad opens depends upon the Error Correcting Code (ECC) used by the code group circuits and the interleaving employed. Thus, the first embodiment (and subsequent embodiments) protect data transmitted between IC dies of a multi-chip module with reduced coding and bond pad redundancy.

The present disclosure provides various aspects that may be employed with one or more of the embodiments. These aspects may be combined with one another singly, doubly, or in total. According to a first aspect of the first embodiment, each first code group circuit of the plurality of first code group circuits directly corresponds to a respective second code group circuit. According to a second aspect of the first embodiment, the first interleaved interconnections interleave data of at least two differing first code group circuits and the second interleaved interconnections interleave data of at least two differing corresponding second code group circuits.

According to a third aspect of the first embodiment, the array of first bond pads is organized in rows and columns and the array of second bond pads is organized in rows and columns. With this aspect, for each row of first bond pads, adjacent first bond pads correspond to differing first code group circuits and for each column of first bond pads, adjacent first bond pads correspond to differing first code group circuits.

According to a fourth aspect of the first embodiment, each of the plurality of first code group circuits is configured to correct a single first bond pad short/open and detect two first bond pad shorts/opens. Further, depending upon the ECC employed and the interleaving pattern, greater numbers of shorts and opens may be detected and corrected.

According to a fifth aspect of the first embodiment, the first interleaved interconnections interleave data of four differing first code group circuits and the second interleaved interconnections interleave data of four differing second code group circuits that correspond to the four differing first code group circuits. With this fifth aspect, for each row of first bond pads, the first interleaved interconnections may establish a four-way interleaving pattern that corresponds to the four differing first code group circuits and for each column of first bond pads, the first interleaved interconnections may establish a four-way interleaving pattern that corresponds to the four differing first code group circuits.

A second embodiment of the present disclosure relates to a method of servicing communications between a first IC die and a second IC die of a multi-chip module. This method includes the first IC die producing data for transmission to the second IC die, the first IC die encoding the data to produce first encoded data in a plurality of code groups, and the first IC die distributing the first encoded data to an array of first bond pads via first interleaved interconnections having a first interleaving pattern that causes the encoded data to be coupled to the array of first bond pads so that bits of each code group couple to non-adjacent first bond pads. Further, the method includes the second IC die receiving the encoded data via an array of second bond pads that electrically couple to the array of first bond pads and via second interleaved interconnections having a second interleaving pattern corresponding to the first interleaving pattern and the second IC die decoding the encoded data to produce decoded data.

The second embodiment also includes a plurality of aspects that may apply singularly or in combination. According to a first aspect of the second embodiment, encoding the data to produce encoded data includes uses a plurality of first code group circuits of the first IC die and decoding the encoded data to produce the decoded data uses a plurality of second code group circuits of the second IC die that directly correspond to the plurality of first code group circuits. With this first aspect, the first interconnections may interleave data of at least two differing first code group circuits and the second interconnections may interleave data of at least two differing corresponding second code group circuits.

According to a second aspect of the second embodiment, the array of first bond pads is organized in rows and columns and the array of second bond pads is organized in rows and columns. With this second aspect, for each row of first bond pads, adjacent first bond pads may correspond to differing first code group circuits of a plurality of first code group circuits and, for each column of first bond pads, adjacent first bond pads may correspond to differing first code group circuits of a plurality of first code group circuits.

According to a third aspect of the second embodiment, the plurality of first code group circuits are each configured to correct a single first bond pad short/open and detect two first bond pad shorts/opens.

According to a fourth aspect of the second embodiment, the first interleaved interconnections interleave data of four differing first code group circuits of a plurality of first code group circuits and the second interleaved interconnections interleave data of four differing second code group circuits of a plurality of second code group circuits that respectively correspond to the four differing first code group circuits. According to this fourth aspect, for each row of first bond pads, a four-way interleaving pattern is established that corresponds to the four differing first code group circuits and for each column of first bond pads, a four-way interleaving pattern is established that corresponds to the four differing first code group circuits. With this fourth aspect, the plurality of first code group circuits may be configured to correct at least two first bond pad shorts/opens and to detect at least three first bond pad shorts/opens.

A third embodiment is directed to a method of servicing communications between a first IC die and an external device. The method includes the first IC die producing data for transmission to the external device, the first IC die encoding the data to produce first encoded data in a plurality of code groups, and the first IC die coupling the first encoded data to an array of first bond pads via first interleaved interconnections having a first interleaving pattern that causes the first encoded data to be coupled to the array of first bond pads so that bits of each code group couple to non-adjacent first bond pads and so that the encoded data is for receipt by the second IC die. The method of the third embodiment also includes the first IC die receiving second encoded data from the external device via the array of first bond pads and via the first interleaved interconnections and the first IC die decoding the second encoded data to produce second decoded data.

The third embodiment includes various aspects that may be applied singularly or in combination. According to a first aspect of the third embodiment, encoding the data to produce the first encoded data includes uses a plurality of first code group circuits of the first IC die and decoding the second encoded data to produce the second decoded data uses the plurality of first code group circuits. With this aspect, the first interconnections interleave data of at least two differing first code group circuits.

According to a second aspect of the third embodiment, the array of first bond pads is organized in rows and columns. Further, for each row of first bond pads, adjacent first bond pads correspond to differing first code group circuits of a plurality of first code group circuits and, for each column of first bond pads, adjacent first bond pads correspond to differing first code group circuits of a plurality of first code group circuits.

Utilizing interleave adjacent pads from different code group, we will correct adjacent pads failure without increasing the area of the bond pad array. These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

FIG. 8 is a flow chart illustrating operations of a second IC die of a multi-chip module according to an embodiment of the present disclosure.

DETAILED DESCRIPTION OF ILLUSTRATIVE EMBODIMENTS

It should be understood at the outset that, although illustrative implementations of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Figure 1:
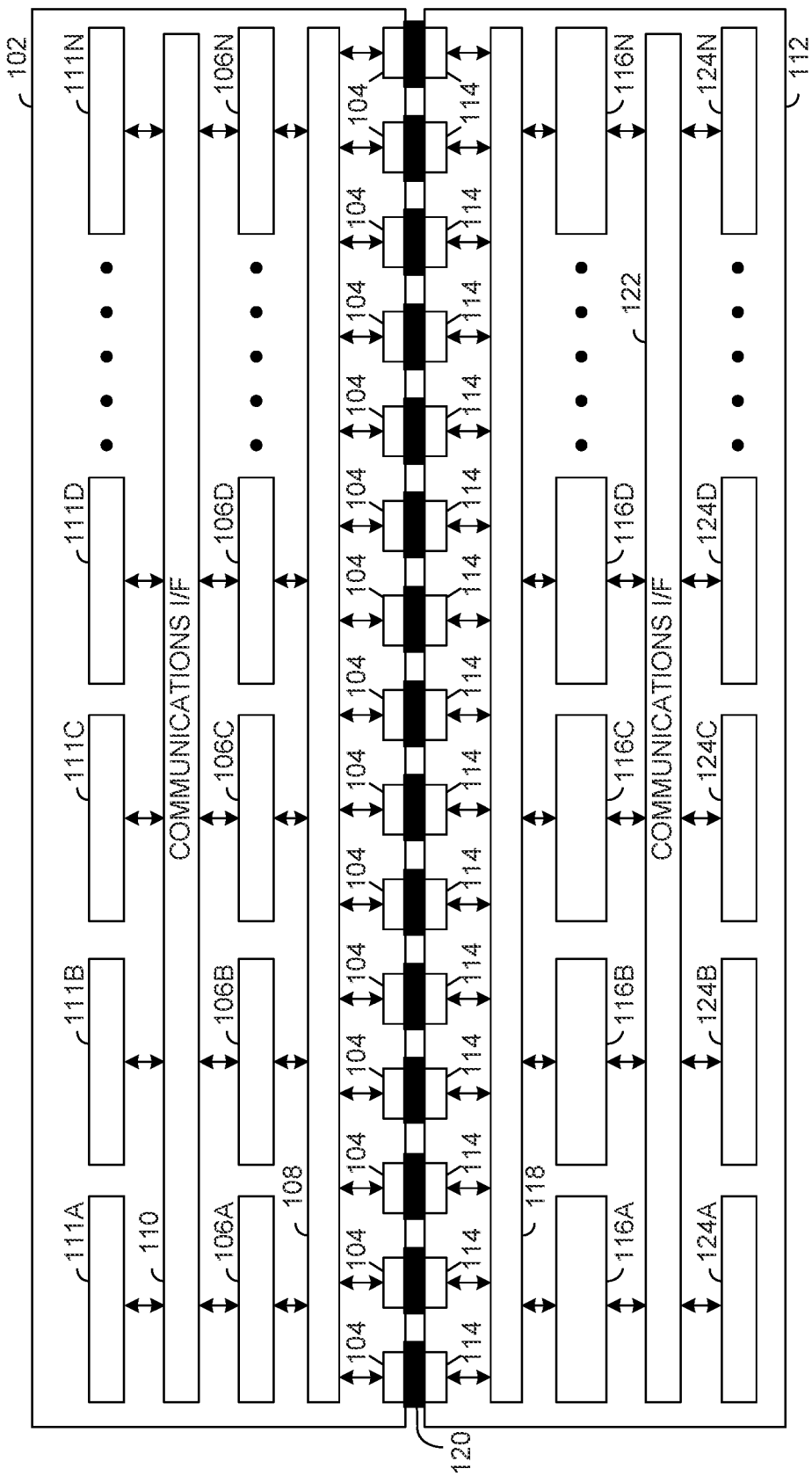
FIG. 1 is a sectional side view illustrating a portion of a multi-chip module having a first IC die and a second IC die constructed according to a described embodiment.

FIG. 1 is a sectional side view illustrating a portion of a multi-chip module having a first Integrated Circuit (IC) 102 die and a second IC die 112 constructed according to a described embodiment. The first IC die 102 includes a plurality of processing systems 11A-111N that intercouple via a communications interface 110. The communications I/F 110 may be a NoC (or a portion of a NoC) and may service all or a portion of the inter-IC die communications for the IC die 102. The first IC die 102 may include additional inter-IC die communications interfaces than those shown in the embodiment 100 of FIG. 1.

The second IC die 112 includes a plurality of processing systems 124A-124N that intercouple via a communications interface 122. The communications I/F 122 may be a NoC and may service all or a portion of the inter-IC die communications for the second IC die 112. The second IC die 112 may include additional inter-IC die communications interfaces than are shown in the embodiment 100 of FIG. 1. The processing circuits 124A-124N may perform functions similar or complementary to the plurality of processing circuits 111A-111N of the first IC die 102.

Each of the first IC die 102 and the second IC die 112 may be a System on a Chip (SoC) that includes the multiple processing systems, e.g., 111A-111N and 124A-124N, respectively, that perform respective functions and have respective structures, e.g., general processor, communications processor (cellular, WiFi, Bluetooth, etc.), network interface processor, image processor, audio processor, graphics processor, arithmetic unit processor, security processor, safety processor, and human interaction processor, memory controller, and computer bus interface processors, among other processing structures. SoCs are often smaller, less expensive, and consume less power than a device that includes separate processing systems. As is appreciated, the first IC die 102 and the second IC die 112 may have additional structures as well. The first IC die 102 and the second IC die 112 may be formed of a semiconductor substrate in a manufacturing process.

The first IC die 102 and the second IC die 112 include structures that allow them to communicate with one another efficiently and with no/few communication errors. To meet these communication requirements, the first IC die 102 also includes an array of first bond pads 104, a plurality of first code group circuits 106A-106N, and first interleaved interconnections 108 between the plurality of first code group circuits 106A-106N and the array of first bond pads 104. The first interleaved interconnections 108 include a first interleaving pattern causing data from different code group circuits 106A-106N to be coupled to adjacent first bond pads of the array of first bond pads 104. The plurality of first code group circuits 106A-106N intercouple with the plurality of processing circuits 111A-111N via at least one communications I/F 110.

The second IC die 112 also includes an array of second bond pads 114 that electrically couple to the array of first bond pads 104. The second IC die 112 also includes a plurality of second code group circuits 116A-116N and second interleaved interconnections 118 between the plurality of second code group circuits 116A-116N and the array of second bond pads 114. The second interleaved interconnections 118 include a second interleaving pattern causing data from different code groups to be coupled to adjacent second bond pads 114. The plurality of second code group circuits 116A-116N intercouple with the plurality of processing circuits 124A-124N via at least one communications I/F 122.

The array of first bond pads 104 may be coupled to the array of second bond pads 114 via copper bond pad bonding 120, which supports reduced pitch of first bond pads 104 and second bond pads 114. Conventional copper bond pad to copper bond pad bonding techniques may be employed to bond the first bond pads 104 to the second bond pads 114. In an alternative structure, solder balls may be used to bond the first bond pads 104 to the second bond pads 114. Note that a gap is shown between the first IC die 102 and the second IC die 112 for illustrative purposes to show the bonding therebetween. In some embodiments, the silicon surface of the first IC die 102 and the second IC die 112 directly abut one another so that that the array of first bond pads 104 directly abuts the array of second bond pads 114.

While a single sandwiched structure of the multi-chip module 100 is shown in FIG. 1 that includes two IC dies 102 and 112, the principles described herein may be applied to a sandwiched structure having three or more IC dies. For example, one IC die may be sandwiched between two IC dies with intercoupling between adjacent IC dies via respective bond pads that are electrically coupled. Thus, an IC die that is sandwiched between two IC dies would have bond pads on both of its planar surfaces to service communications therebetween. Further, while not shown in FIG. 1, the first IC die 102 and/or the second IC die may have additional bond pads (not shown) that service the coupling of the multi-chip module to external devices.

With the multi-chip module 100 of FIG. 1, each first code group circuit of the plurality of first code group circuits 106A-106N directly corresponds to a respective second code group circuit 116A-116N, i.e., first code group circuit 106A corresponds to second code group circuit 116A, first code group circuit 106B corresponds to second code group circuit 116C, and first code group circuit 106C corresponds to second code group circuit 116C, etc. As will be described further herein with reference to FIGS. 6A-8, with inter IC die communications serviced according to the present disclosure, data between the first IC die 102 and the second IC die 112 is, for example, encoded by a first code group circuit 106A of the first IC die 102, and coupled via the first interleaved interconnections 108 to respective first bond pads 104. The data is then coupled to the second bond pads 114 and coupled by the second interleaved interconnections 118 from the second bond pads 114 to a second code group circuit 116B of the second IC die 112. The second code group circuit 116 of the second IC die 112 decodes the encoded data to produce data for transmission to the second IC die 112. With the coding/interleaving/decoding of the present disclosure, at least some bond pad shorts/opens may be overcome. The ability of the first IC die 102 and the second IC die 112 to detect and correct errors caused by bond pad shorts/opens is based upon the coding redundancy and the interleaving patterns employed.

With one particular example, the first interleaved interconnections 108 interleave data of at least two differing first code group circuits and the second interleaved interconnections 118 interleave data of at least two differing corresponding second code group circuits. With this example, each of the plurality of first code group circuits 106A-106B and the plurality of second code group circuits 116A-116B may configured to correct a single adjacent bond pad short, detect two or more adjacent bond pad short, and correct two or more bond pad opens using one type of Error Correcting Code (ECC). With another particular example, the first interleaved interconnections 108 interleave data of four differing first code group circuits, e.g., 104A-104D and the second interleaved interconnections 118 interleave data of four differing second code group circuits that correspond to the four differing first code group circuits. Depending upon the coding used, with this example, the first code group circuits 106A-106D and the plurality of second code group circuits 116A-116D are able to correct at least two first bond pad 104 shorts/opens and detect at least three first bond pad 104 shorts/opens using one type of ECC. Of course, with higher error correcting performance using different ECCs using more redundancy bits, greater numbers of bond pad opens/shorts may be corrected and detected. The tradeoff between lesser and greater ECCs is based upon bond pad number and coding/decoding load.

Figure 3:
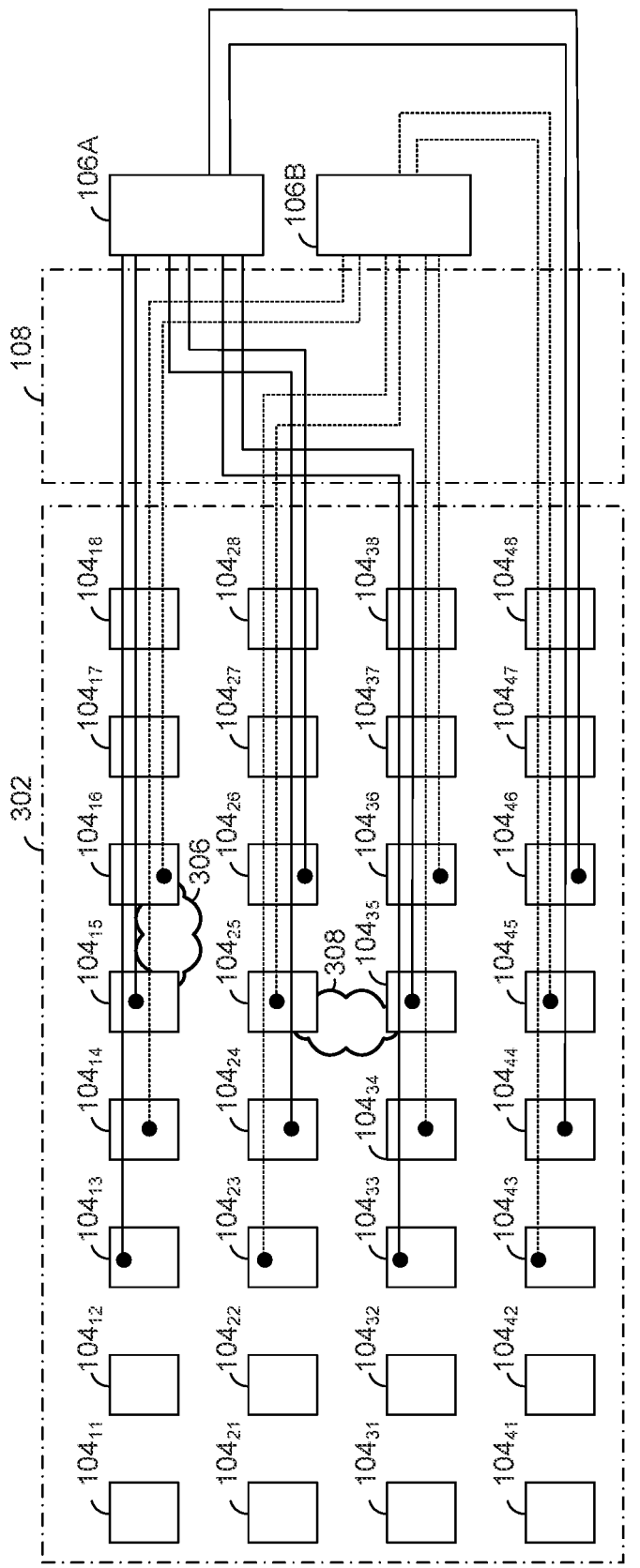
FIG. 3 is a diagrammatic top view of a portion of the first IC die of FIG. 1 according to a first aspect of the embodiment of FIG. 1.
Figure 4:
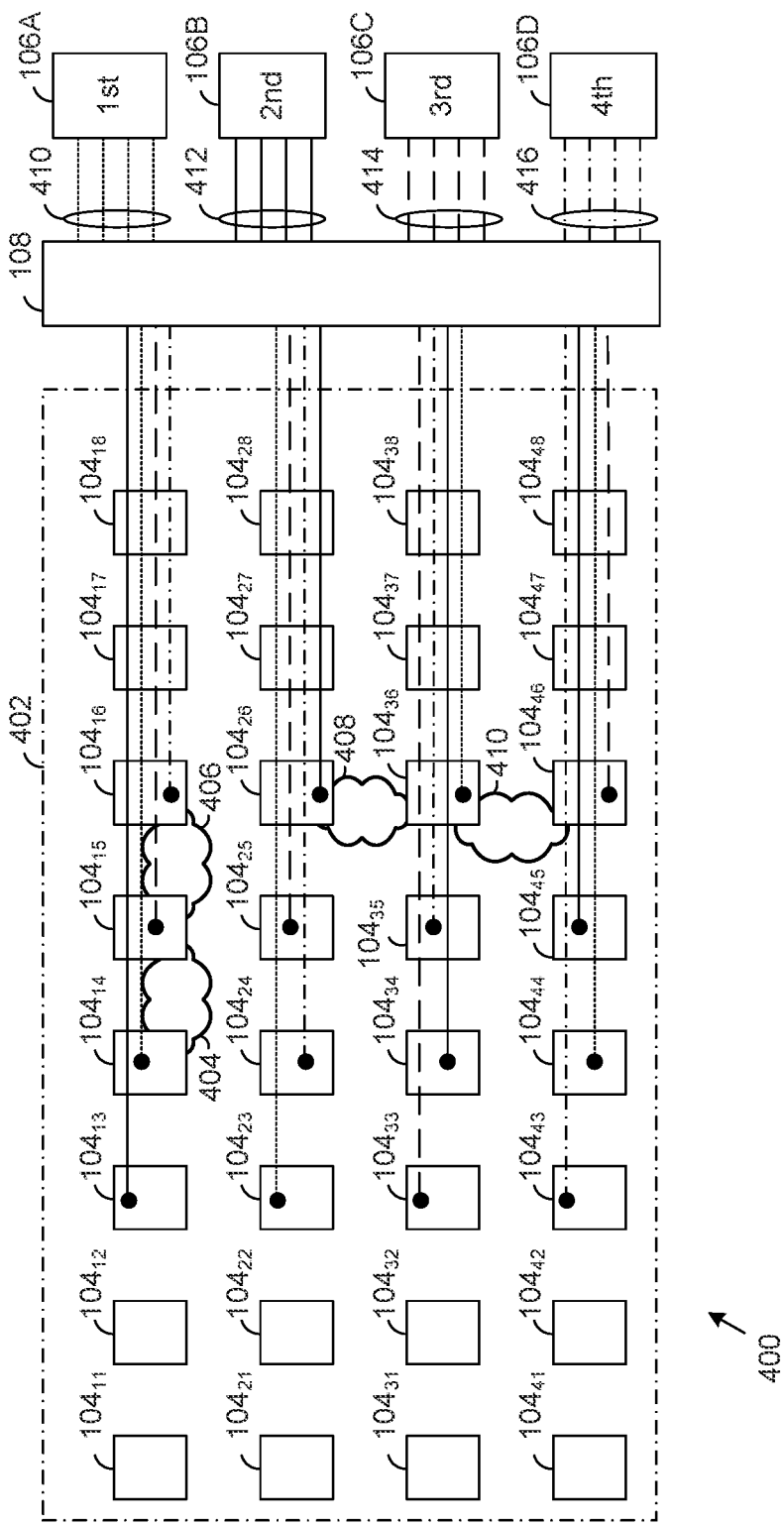
FIG. 4 is a diagrammatic top view of a portion of the first IC die of FIG. 1 according to a second aspect of the embodiment of FIG. 1.

As will be further illustrated in FIGS. 3 and 4, the array of first bond pads 104 is organized in rows and columns and the array of second bond pads 114 is organized in rows and columns. With one aspect of this structure, for each row of first bond pads 104, adjacent first bond pads 104 correspond to differing first code group circuits 106A-106N and for each column of first bond pads 104, adjacent first bond pads 104 correspond to differing first code group circuits 106A-106N. When first interleaved interconnections 108 interleave data of four differing first code group circuits 106A-106D, the second interleaved interconnections 118 interleave data of four differing second code group circuits 116A-116D that correspond to the four differing first code group circuits 106A-106D. In such case, for each row of first bond pads 104, the first interleaved interconnections 108 establish a four-way interleaving pattern that corresponds to the four differing first code group circuits 106A-106D and for each column of first bond pads 104, the first interleaved interconnections 108 establish a four-way interleaving pattern that corresponds to the four differing second code group circuits 116A-116D.

Figure 2:
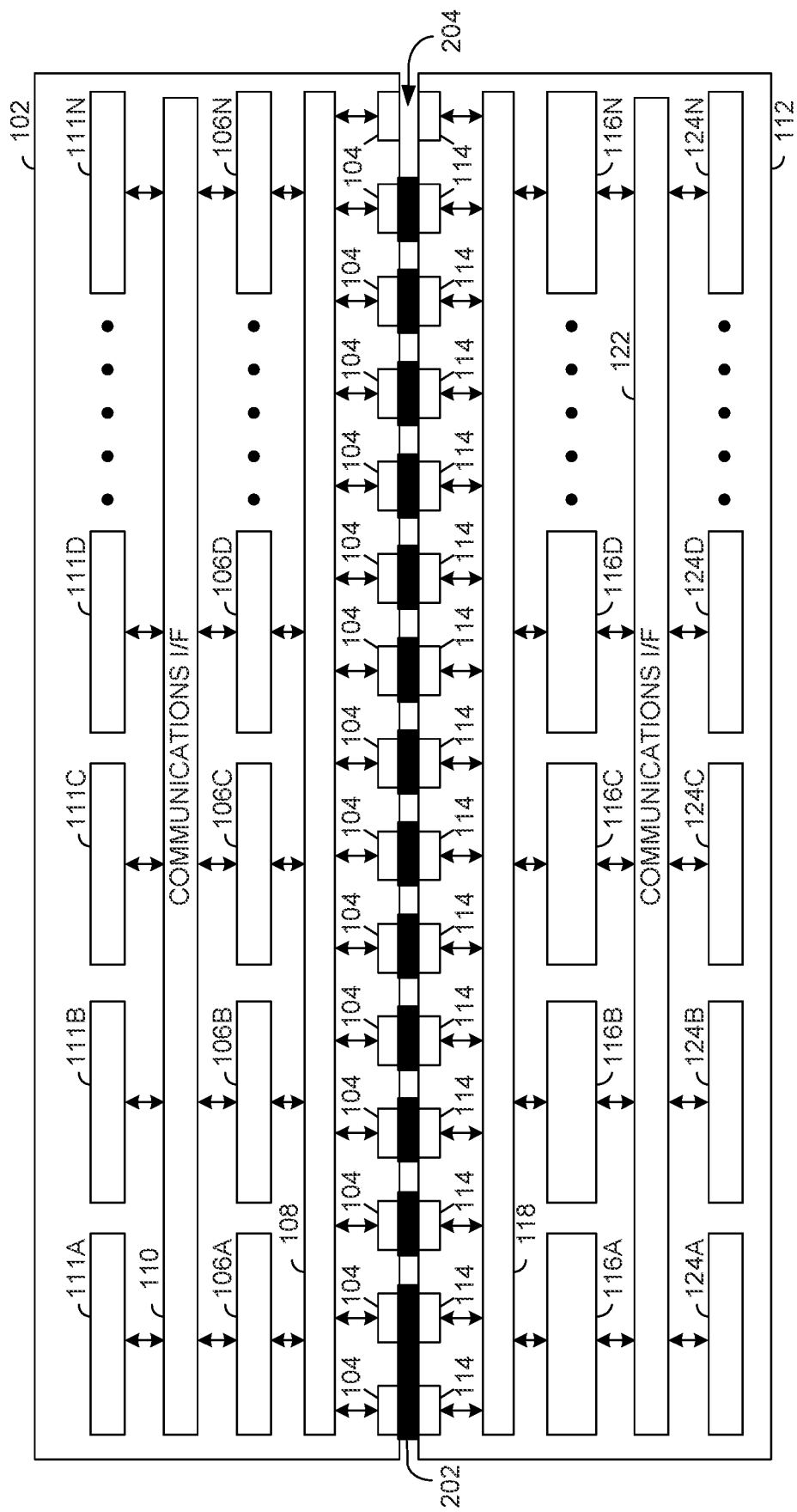
FIG. 2 is a sectional side view illustrating of the multi-chip module of FIG. 1 with a bond pad short and a bond pad open according to a described embodiment.

FIG. 2 is a sectional side view illustrating of the multi-chip module of FIG. 1 with a bond pad short and a bond pad open according to a described embodiment. As compared to the example 100 of FIG. 1, the example 200 of FIG. 2 includes a bond pad short 202 that shorts adjacent first bond pads 104 and adjacent second bond pads 114. Further, there is shown a bond pad open in which bond pads 104 and 114 fail to electrically couple. With the coding/interleaving/decoding structure described with reference to FIG. 1, the adjacent bond pad short and/or single bond pad open is overcome to preserve the data link between the first IC die 102 and the second IC die 112. FIGS. 6A-8 will described the operations that support this correction procedure. Depending upon the level of interleaving and the ECC used by the first code group circuits 106A-106D and the plurality of second code group circuits 116A-116D, the embodiments of the present disclosure have the capability to correct two or more adjacent bond pad failures and to detect three or more bond pad failures.

FIG. 3 is a diagrammatic top view of a portion 300 of the first IC die of FIG. 1 according to a first aspect of the embodiment of FIG. 1. With the portion 300 of FIG. 3, a portion 302 of the array of first bond pads 104 is organized in rows and columns with bond pads 104 denoted $104_{I,J}$, where I refers to a row and J refers to a column. With the portion 300 of FIG. 3, an illustrated portion of the first interleaved interconnections 108 interleave data of at least two differing first code group circuits, e.g., 106A and 106B. Thus, with the portion 300 of FIG. 3, for each row of first bond pads 104, adjacent first bond pads 104 correspond to differing first code group circuits 106A or 106B and for each column of first bond pads 104, adjacent first bond pads 104 correspond to differing first code group circuits 106A or 106B.

With the portion 300 of FIG. 3, each of the plurality of first code group circuits 106A-106B is configured to correct a single adjacent bond pad short 306 or 308, to correct multiple bond pad opens, and detect two adjacent first bond pad 104 shorts with one ECC. Bond pad short 306 shorts the data of two differing first code group circuits 106A and 106B and bond bad short 308 shorts the data of two differing first code group circuits 106A and 106B. Based upon the coding used by the first code group circuits 106A and 106B and 116A and 116B, even though data associated with these two bond pads $104_{15}$ and $104_{16}$ (or $104_{25}$ and $104_{35}$) is shorted, the data transmitted between the first IC die 102 and the second IC die 112 is correct. Using differing ECC, the portion 300 of FIG. 3 may correct more than one adjacent bond pad short, detect more than two adjacent bond pad shorts, and correct at least two bond pad opens.

While the components of the second IC die 112 are not shown in FIG. 3, the second IC die 112 includes components that are complementary to the components of the first IC die 102. The array of second bond pads 114 (not shown) is also organized in rows and columns and complements the array 302 of first bond pads 104. Further, the example shown in FIG. 4 may be extended across all of the array of first bond pads 104 and the array of second bond pads 114 as well as to the other code group circuits.

FIG. 4 is a diagrammatic top view of a portion 400 of the first IC die of FIG. 1 according to a second aspect of the embodiment of FIG. 1. The portion 402 of the array of first bond pads 104 is organized in rows and columns with bond pads denoted $104_{I,J}$, where I refers to a row and J refers to a column. While the components of the second IC die 112 are not shown in FIG. 4, analogous structure of the second IC die 112 complementary to the components of the first IC die 102 shown is present.

With the portion 400 of FIG. 4, the first interleaved interconnections 108 interleave data of four differing first code group circuits 106A-106D and the second interleaved interconnections 118 interleave data of four differing second code group circuits 116A-116D that correspond to the four differing first code group circuits 106A-106D. In such case, for each row of first bond pads 104, the first interleaved interconnections 108 establish a four-way interleaving pattern that corresponds to the four differing first code group circuits 106A-106D and for each column of first bond pads 104, the first interleaved interconnections 108 establish a four-way interleaving pattern that corresponds to the four differing first code group circuits 106A-106D. The portion 400 of FIG. 4 is able to correct at least two adjacent first bond pad 104, e.g., short 404 between first bond pads $104_{14}$ and $104_{15}$ and short 406 between first bond pad $104_{15}$ and $104_{16}$ using a first ECC. Likewise, the portion 400 of FIG. 4 is able to correct at least two adjacent first bond pad 104 shorts in a column, e.g., short 408 between first bond pads $104_{26}$ and $104_{36}$ and short 410 between first bond pad $104_{36}$ and $104_{46}$ using a first ECC. The portion 400 is also able to detect more than two adjacent first bond pad 104 shorts and indicate this to controlling circuitry of the first IC die 102 using a first ECC. The use of a differing, more robust, ECC enables for the correction of more than two adjacent bond pad shorts/opens and the detection of more than three adjacent bond pad shorts. Detection and correction of bond pad opens is serviced in similar fashion.

Figure 5:
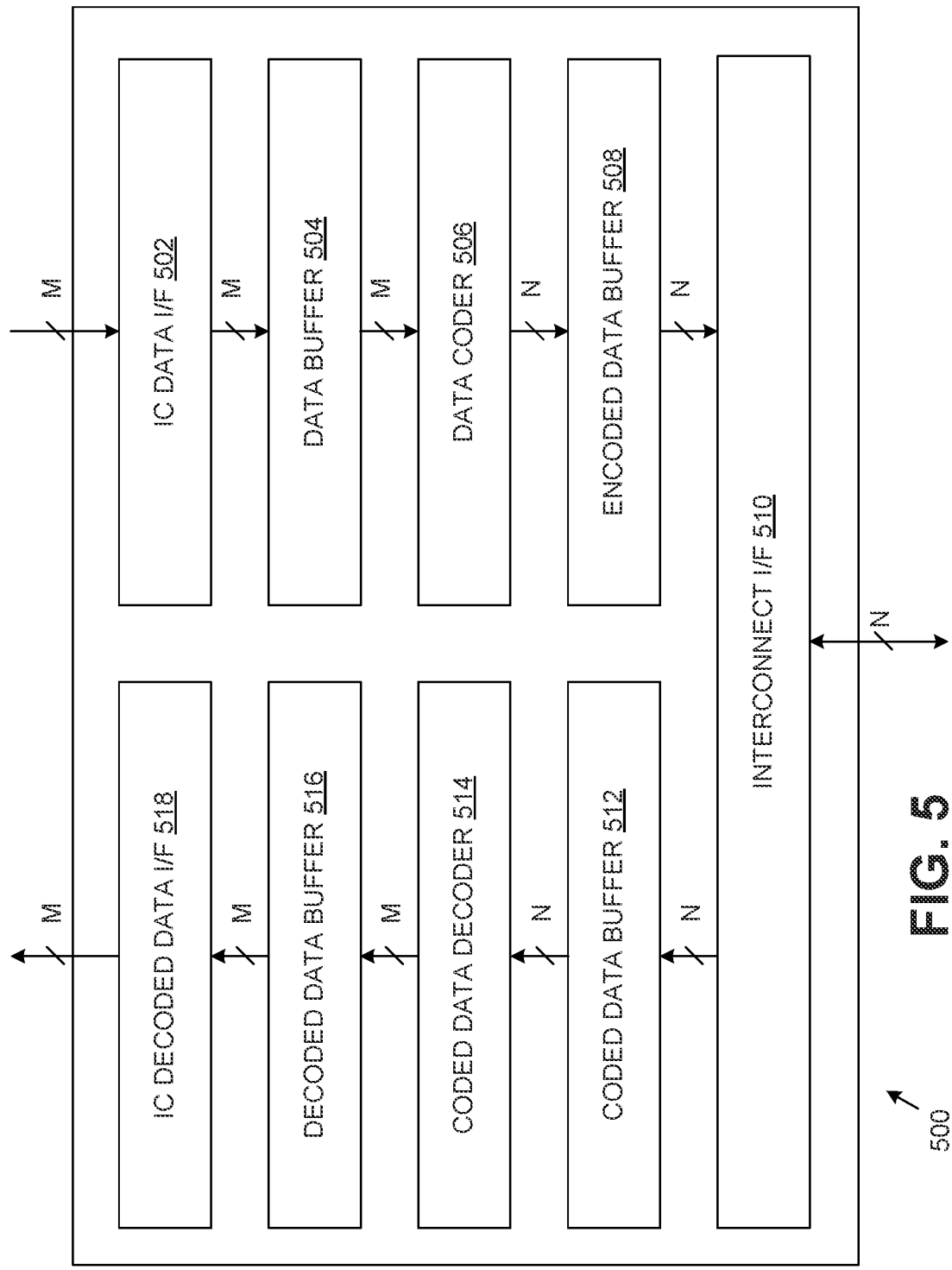
FIG. 5 is a block diagram illustrating a code group circuit constructed according to an embodiment of the present disclosure.

FIG. 5 is a block diagram illustrating a code group circuit constructed according to an embodiment of the present disclosure. The code group circuit 500 may be one of the first code group circuits 106A-106N formed in the first IC die 202 or one the second code group circuits 116A-116N formed in the second IC die 112 of FIG. 1. Assuming that the code group circuit 500 is formed in the first IC die 102, the first code group circuit 500 includes an IC data interface 502 that receives data (M bits) for transmission from the first IC die 102 to the second IC die 112. Output data buffer 504 buffers the data, data coder 506 encodes the data according to a programmed ECC technique, and encoded data buffer 508 buffers the encoded data.

Interconnect I/F 510 interfaces with interleaved interconnections, which couple the coded data to corresponding bond pads. Note that the interconnect I/F 510 services a single bi-directional data path. In different embodiments, there are separate transmit and receive data paths.

For data received from a differing IC die, the interconnect I/F 510 receives coded data from a differing IC die via bond pads and interleaved interconnections coupled thereto. Coded data buffer 512 buffers the coded data, coded data decoder 514 decodes the coded data to produce decoded data and the decoded data buffer 516 buffers the decoded data. The IC decoded data I/F 518 provides the decoded data internally to the IC die for further use. Note that the data and the decoded data have a width of M bits while the encoded data has a width of N bits, where N is greater than M by a coding factor. Various coding techniques may be used to perform the encoding/decoding functions, e.g., Hamming codes and other simple block codes. A tradeoff exists between the complexity of the coding technique used and the ability of the coding technique to detect/correct errors caused by bond pad shorts/opens.

Figure 6A:
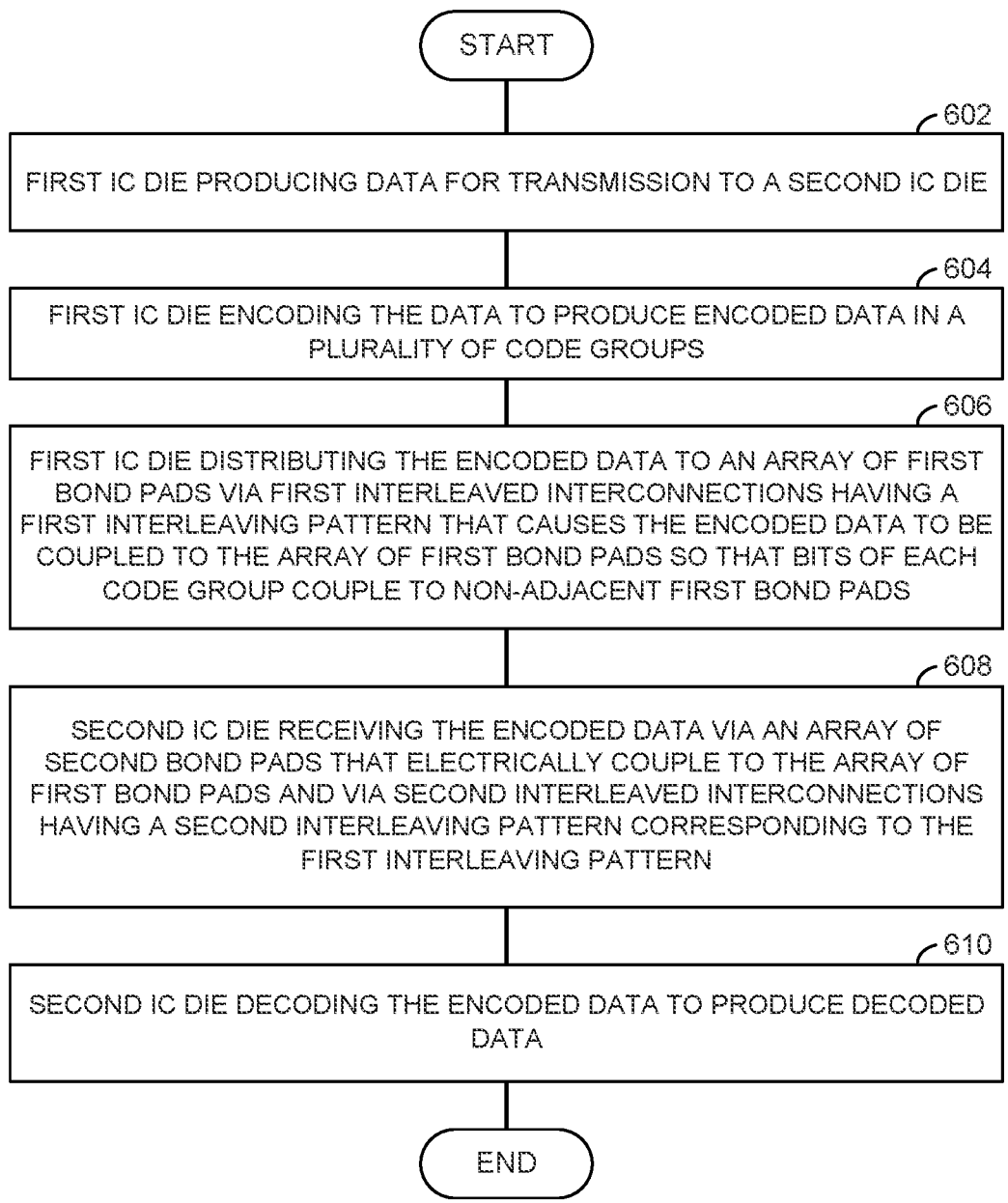
FIG. 6A is a flow chart illustrating operations of a multi-chip module according to an embodiment of the present disclosure.

FIG. 6A is a flow chart illustrating operations of a multi-chip module according to an embodiment of the present disclosure. The operations 600 of FIG. 6A begin with a first IC die producing data for transmission to the second IC die (step 602). Operations 600 continue with the first IC die encoding the data to produce encoded data in a plurality of code groups (step 604). Next, operations 600 continue with the first IC die distributing the encoded data to an array of first bond pads via first interleaved interconnections having a first interleaving pattern that causes the encoded data to be coupled to the array of first bond pads so that bits of each code group couple to non-adjacent first bond pads (step 606).

Next, operations 600 include the second IC die receiving the encoded data via an array of second bond pads that electrically couple to the array of first bond pads and via second interleaved interconnections having a second interleaving pattern corresponding to the first interleaving pattern (step 608). Operations 600 conclude with the second IC die decoding the encoded data to produce decoded data (step 610).

The operations 600 of FIG. 6A may be employed with particular structure. With According to a first aspect of the embodiment of FIG. 6, encoding the data to produce encoded data includes uses a plurality of first code group circuits of the first IC die and decoding the encoded data to produce the decoded data uses a plurality of second code group circuits of the second IC die that directly correspond to the plurality of first code group circuits. With this aspect, the first interconnections interleave data of at least two differing first code group circuits and the second interconnections interleave data of at least two differing corresponding second code group circuits.

According to a first aspect of this structure, the array of first bond pads may be organized in rows and columns and the array of second bond pads is organized in rows and columns. With a first aspect of this structure, for each row of first bond pads, adjacent first bond pads correspond to differing first code group circuits of a plurality of first code group circuits and for each column of first bond pads, adjacent first bond pads correspond to differing first code group circuits of a plurality of first code group circuits. With this aspect, the plurality of first code group circuits are each configured to correct a single first bond pad short/open and detect two first bond pad shorts/opens.

According to a second aspect of this structure, the first interleaved interconnections interleave data of four differing first code group circuits of a plurality of first code group circuits and the second interleaved interconnections interleave data of four differing second code group circuits of a plurality of second code group circuits that respectively correspond to the four differing first code group circuits. With this second aspect of this structure, for each row of first bond pads, a four-way interleaving pattern is established that corresponds to the four differing first code group circuits and for each column of first bond pads, a four-way interleaving pattern is established that corresponds to the four differing first code group circuits. In such case the plurality of first code group circuits are configured to correct at least two first bond pad shorts, and to detect at least three first bond pad shorts, and to correct at least three first bond pad opens.

Figure 6B:
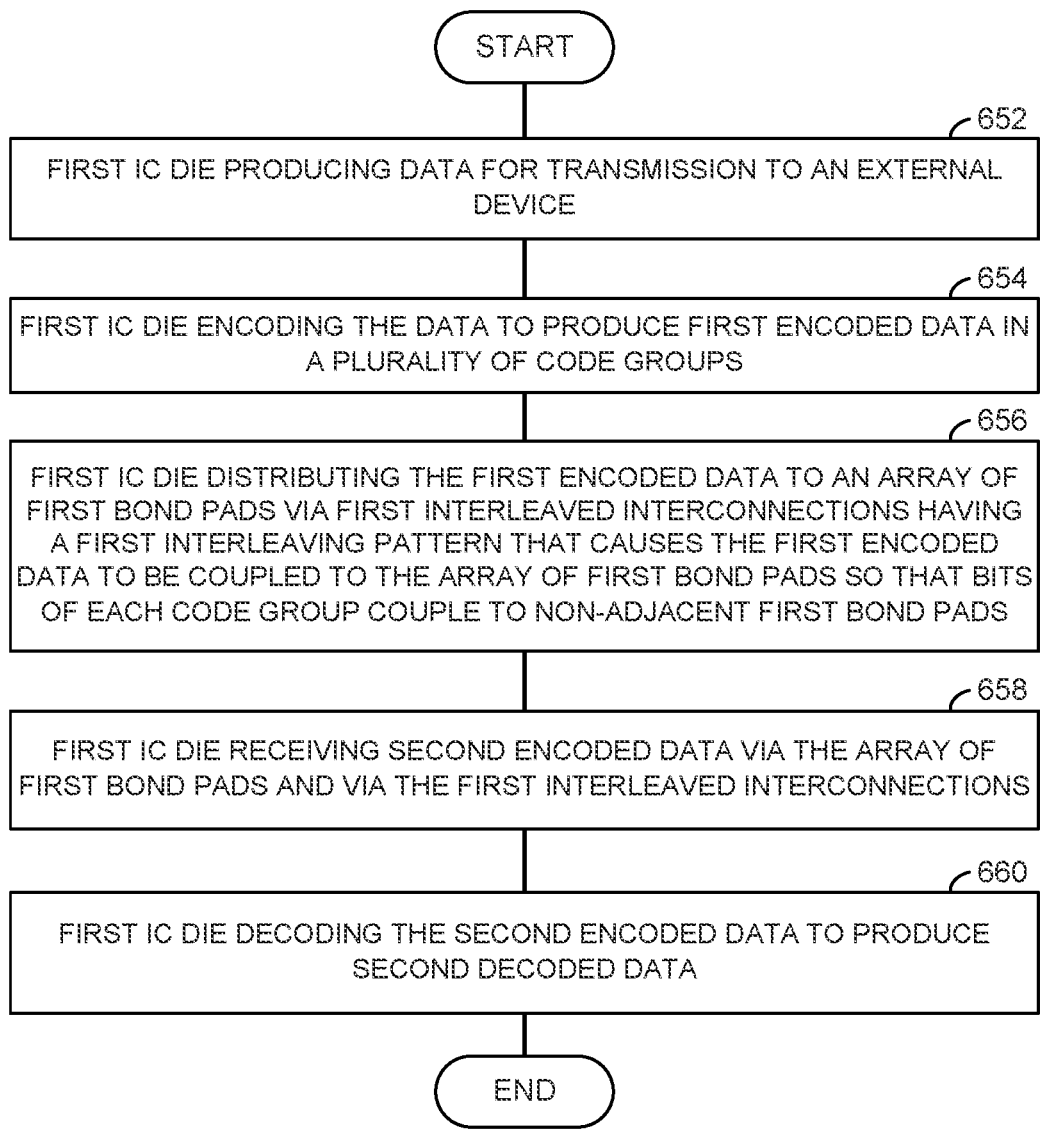
FIG. 6B is a flow chart illustrating operations of a first IC die of a multi-chip module according to an embodiment of the present disclosure.

FIG. 6B is a flow chart illustrating operations of a first IC die communicating with an external device according to an embodiment of the present disclosure. The external device may be a second IC die of a multi-chip module, a differing IC die, or another device that is communication with the first IC die. The operations 650 of FIG. 6B begin with a first IC die producing data for transmission to the external device (step 652). Operations 650 continue with the first IC die encoding the data to produce encoded data in a plurality of code groups (step 654). Next, operations 650 continue with the first IC die distributing the encoded data to an array of first bond pads via first interleaved interconnections having a first interleaving pattern that causes the encoded data to be coupled to the array of first bond pads so that bits of each code group couple to non-adjacent first bond pads (step 656).

Next, operations 650 include the first IC die receiving second encoded data from the external device via the array of first bond pads and via the first interleaved interconnections having the first interleaving pattern (step 658). Operations 650 conclude with the first IC die decoding the second encoded data to produce second decoded data (step 660). The operations 650 of FIG. 6B include various aspects that are same/similar to the aspects described with reference to FIG. 6A.

Figure 7:
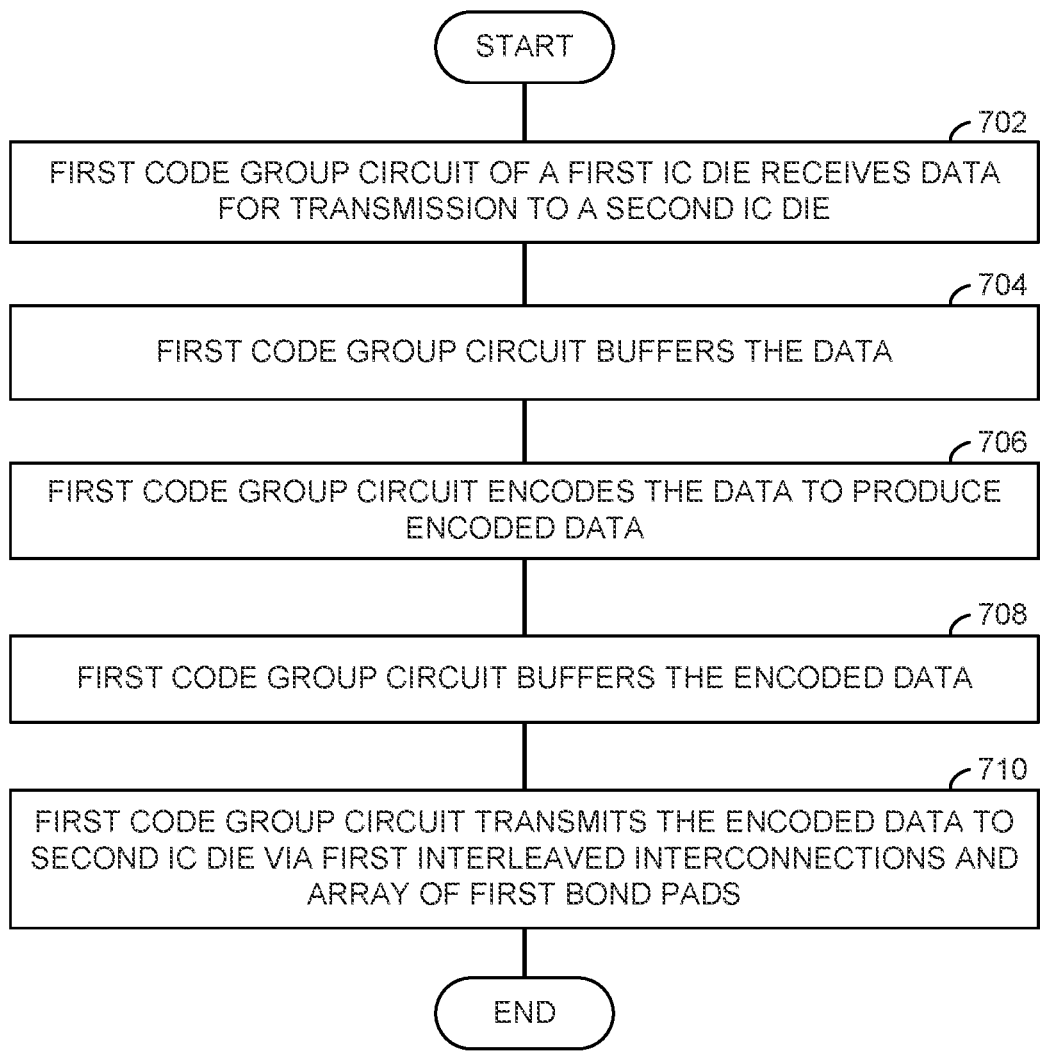
FIG. 7 is a flow chart illustrating operations of a first IC die of a multi-chip module according to an embodiment of the present disclosure.

FIG. 7 is a flow chart illustrating operations of a first IC die of a multi-chip module according to an embodiment of the present disclosure. The operations 700 of FIG. 7 are consistent with the operations of FIGS. 6A and 6B and the structure of FIGS. 1-5. Operations 700 begin with the first code group circuit of the first IC die receiving data to be transmitted to a second IC die (step 702). The first code group circuit then buffers the data (step 704). The first code group circuit then encodes the data to produce coded data (step 706). Next, the first code group circuit buffers the encoded data (step 708). Finally, the first code group circuit transmits the encoded data to a second IC die via first interleaved interconnections and an array of first bond pads (step 710).

FIG. 8 is a flow chart illustrating operations of a second IC die of a multi-chip module according to an embodiment of the present disclosure. The operations 800 of FIG. 8 are complementary to the operations 700 of FIG. 7 but from the perspective of a second IC die that is receiving data from the first IC die. Operations 800 commence with a second code group circuit of a second IC die receiving encoded data from a first IC die via an array of second bond pads and second interleaved interconnections (step 802). Operations 800 continue with the second code group circuit of the second IC die buffering the encoded data (step 804) and the second code group circuit decoding the encoded data to produce decoded data (806). The second code group circuit then buffers the decoded data (step 808) and then forwards the decoded data for use by the second IC die (step 810).

Utilizing interleave adjacent pads from different code group, we will correct adjacent pads failure without increasing the area of the bond pad array. While several embodiments have been provided in the present disclosure, it may be understood that the disclosed systems and methods might be embodied in many other specific forms without departing from the spirit or scope of the present disclosure. The present examples are to be considered as illustrative and not restrictive, and the disclosure is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

The invention claimed is:

1. A multi-chip module comprising:
a first Integrated Circuit (IC) die including first bond pads, first code group circuits, and first interleaved interconnections between the first code group circuits and the first bond pads, the first interleaved interconnections including a first interleaving pattern coupling the first code group circuits to the first bond pads; and
a second IC die including a second bond pads electrically coupled to the first bond pads, second code group circuits, and second interleaved interconnections between the second code group circuits and the second bond pads, the second interleaved interconnections including a second interleaving pattern coupling the second code group circuits to the second bond pads.

2. The multi-chip module of claim 1, wherein each of the first code group circuits directly corresponds to a respective one of the second code group circuits.

3. The multi-chip module of claim 1, wherein each of the first interleaved interconnections are configured to interleave data of at least two of the first code group circuits, and each of the second interleaved interconnections interleave are configured to interleave data of at least two of the second code group circuits.

4. The multi-chip module of claim 1, wherein the first bond pads is organized in rows and columns, and the second bond pads is organized in rows and columns.

5. The multi-chip module of claim 4, wherein for each row of first bond pads, adjacent first bond pads correspond to different ones of the first code group circuits, and wherein for each column of first bond pads, adjacent first bond pads correspond to different ones of the first code group circuits.

6. The multi-chip module of claim 1, wherein each of the first code group circuits is configured to correct a single first bond pad short/open and detect two first bond pad shorts/opens.

7. The multi-chip module of claim 1, wherein the first interleaved interconnections interleave data of four of the first code group circuits, and the second interleaved interconnections interleave data of four of the second code group circuits, the four second code group circuits corresponding to the four first code group circuits.

8. The multi-chip module of claim 7, wherein for each row of first bond pads, the first interleaved interconnections establish a four-way interleaving pattern that corresponds to the four first code group circuits, and for each column of first bond pads, the first interleaved interconnections establish a four-way interleaving pattern that corresponds to the four first code group circuits.

9. The multi-chip module of claim 1, wherein the plurality of first code group circuits are configured to correct at least two first bond pad shorts/opens and to detect at least three first bond pad shorts/opens.

10. A method of servicing communications between a first Integrated Circuit (IC) die and a second IC die of a multi-chip module, the method comprising:
encoding, by the first IC die, data to produce first encoded data in a plurality of code groups;
distributing, by the first IC die, the first encoded data to first bond pads via first interleaved interconnections having a first interleaving pattern coupled to the first bond pads so that bits of each code group are distributed to non-adjacent ones of first bond pads;
receiving, by the second IC die, the encoded data via second bond pads that electrically couple to the first bond pads and via second interleaved interconnections having a second interleaving pattern corresponding to the first interleaving pattern; and
decoding, by the second IC die, the encoded data to produce decoded data.

11. The method of claim 10, wherein encoding the data to produce encoded data includes using first code group circuits of the first IC die, and
wherein decoding the encoded data to produce the decoded data includes using second code group circuits of the second IC die, the second code group circuits directly corresponding to the first code group circuits.

12. The method of claim 11, wherein each of the first interleaved interconnections are configured to interleave data of at least two of the first code group circuits, and each of the second interleaved interconnections interleave are configured to interleave data of at least two of the second code group circuits.

13. The method of claim 11, wherein the first bond pads is organized in rows and columns, and the second bond pads is organized in rows and columns.

14. The method of claim 13, wherein for each row of first bond pads, adjacent first bond pads correspond to different ones of the first code group circuits, and wherein for each column of first bond pads, adjacent first bond pads correspond to different ones of the first code group circuits.

15. The method of claim 1, wherein each of the first code group circuits is configured to correct a single first bond pad short/open and detect two first bond pad shorts/opens.

16. The method of claim 11, wherein the first interleaved interconnections interleave data of four of the first code group circuits, and the second interleaved interconnections interleave data of four of the second code group circuits, the four second code group circuits corresponding to the four first code group circuits.

17. The method of claim 16, wherein for each row of first bond pads, the first interleaved interconnections establish a four-way interleaving pattern that corresponds to the four first code group circuits, and for each column of first bond pads, the first interleaved interconnections establish a four-way interleaving pattern that corresponds to the four first code group circuits.

18. The method of claim 11, wherein the plurality of first code group circuits are configured to correct at least two first bond pad shorts/opens and to detect at least three first bond pad shorts/opens.

19. A method of servicing communications between an Integrated Circuit (IC) die and an external device, the method comprising:
    producing, by a first IC die, data for transmission to the external device;
    encoding, by the first IC die, the data to produce first encoded data in a plurality of code groups, the first IC die coupling the first encoded data to first bond pads via first interleaved interconnections having a first interleaving pattern that causes bits of each code group to be distributed to non-adjacent ones of the first bond pads so that the encoded data is received by the external device;
    receiving, by the first IC die, second encoded data from the external device via the first bond pads and via the first interleaved interconnections; and
    decoding, by the first IC die, the second encoded data to produce second decoded data.

20. The method of claim 19, wherein encoding the data to produce encoded data includes using first code group circuits of the first IC die, and
    wherein decoding the encoded data to produce the decoded data includes using first code group circuits.

21. The method of claim 20, wherein each of the first interleaved interconnections are configured to interleave data of at least two of the first code group circuits.

22. The method of claim 20, wherein the first bond pads are organized in rows and columns.

23. The method of claim 22, wherein for each row of first bond pads, adjacent first bond pads correspond to different ones of the first code group circuits, and wherein for each column of first bond pads, adjacent first bond pads correspond to different ones of the first code group circuits.

* * * * *